(12) United States Patent
Yamazaki et al.

(10) Patent No.: US 8,575,818 B2
(45) Date of Patent: Nov. 5, 2013

(54) SURFACE ACOUSTIC WAVE ELEMENT

(75) Inventors: Hisashi Yamazaki, Nagaokakyo (JP);
Hideaki Takahashi, Nagaokakyo (JP);
Taku Kikuchi, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 13/219,739

(22) Filed: Aug. 29, 2011

(65) Prior Publication Data
US 2011/0309719 A1    Dec. 22, 2011

Related U.S. Application Data

(63) Continuation of application No. PCT/JP2010/053390, filed on Mar. 3, 2010.

(30) Foreign Application Priority Data

Mar. 4, 2009  (JP) ................................ 2009-051039
Dec. 15, 2009 (JP) ................................ 2009-284179

(51) Int. Cl.
*H01L 41/08*    (2006.01)
*H03H 9/00*     (2006.01)

(52) U.S. Cl.
CPC ................................. *H03H 9/0009* (2013.01)
USPC ..................................................... 310/313 B

(58) Field of Classification Search
USPC ........................................................ 310/313
See application file for complete search history.

(56) References Cited

U.S. PATENT DOCUMENTS

| 5,923,231 | A  | * | 7/1999 | Ohkubo et al. ............... 333/193 |
| 6,791,237 | B2 | * | 9/2004 | Yamanouchi ............. 310/313 R |
| 7,209,018 | B2 | * | 4/2007 | Nakao et al. .................. 333/195 |
| 7,345,400 | B2 | * | 3/2008 | Nakao et al. .............. 310/313 A |
| 7,411,334 | B2 | * | 8/2008 | Nishiyama et al. ....... 310/313 R |

(Continued)

FOREIGN PATENT DOCUMENTS

| EP | 1 544 998 A2 | 6/2005 |
| EP | 1 628 396 A1 | 2/2006 |

(Continued)

OTHER PUBLICATIONS

Official Communication issued in International Patent Application No. PCT/JP2010/053390, mailed on Apr. 6, 2010.

*Primary Examiner* — J. San Martin
(74) *Attorney, Agent, or Firm* — Keating & Bennett, LLP

(57) ABSTRACT

A surface acoustic wave element has a small energy loss and when it is used in a filter device, suppresses a spurious component occurring near the resonant frequency of a principal response and improves the frequency characteristic near the pass band of the filter device. The surface acoustic wave element includes a piezoelectric substrate, a comb-shaped electrode, and an insulating film. The comb-shaped electrode is disposed on the piezoelectric substrate. The insulating film is disposed so as to cover the piezoelectric substrate and the comb-shaped electrode. Where $\lambda$ is the wavelength of an elastic wave that propagates in the piezoelectric substrate and h is the difference between the maximum and minimum values of a thickness dimension from the top surface of the piezoelectric substrate to the top surface of the insulating film, $0.01 \leq h/\lambda \leq 0.03$ is satisfied.

6 Claims, 4 Drawing Sheets

(56) References Cited

U.S. PATENT DOCUMENTS

| | | | |
|---|---|---|---|
| 7,538,636 B2 * | 5/2009 | Takayama et al. | 333/193 |
| 7,589,606 B2 * | 9/2009 | Takayama et al. | 333/193 |
| 7,812,688 B2 * | 10/2010 | Nakamura et al. | 333/133 |
| 7,855,619 B2 * | 12/2010 | Takayama et al. | 333/193 |
| 8,035,460 B2 * | 10/2011 | Nakanishi et al. | 333/133 |
| 8,072,293 B2 * | 12/2011 | Nakamura et al. | 333/133 |
| 2008/0303379 A1 * | 12/2008 | Nakai et al. | 310/313 R |
| 2010/0072856 A1 | 3/2010 | Kadota et al. | |
| 2010/0141088 A1 | 6/2010 | Matsuda et al. | |

FOREIGN PATENT DOCUMENTS

| | | |
|---|---|---|
| EP | 1 768 255 A1 | 3/2007 |
| EP | 1 988 630 A1 | 11/2008 |
| JP | 2005-176152 A | 6/2005 |
| WO | 2004/105237 A1 | 12/2004 |
| WO | 2006/003933 A1 | 1/2006 |
| WO | 2007/097186 A1 | 8/2007 |
| WO | 2008/149620 A1 | 12/2008 |
| WO | 2009/022410 A1 | 2/2009 |

* cited by examiner

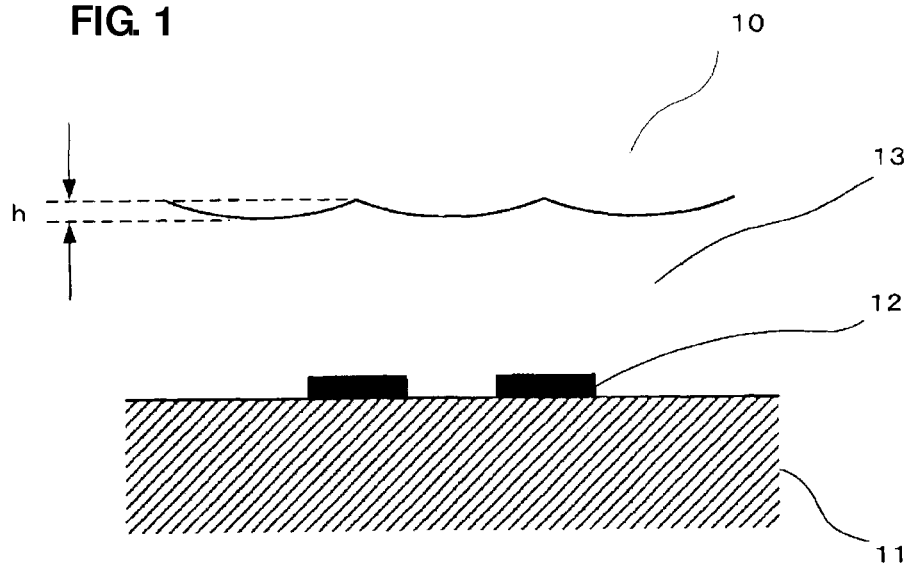
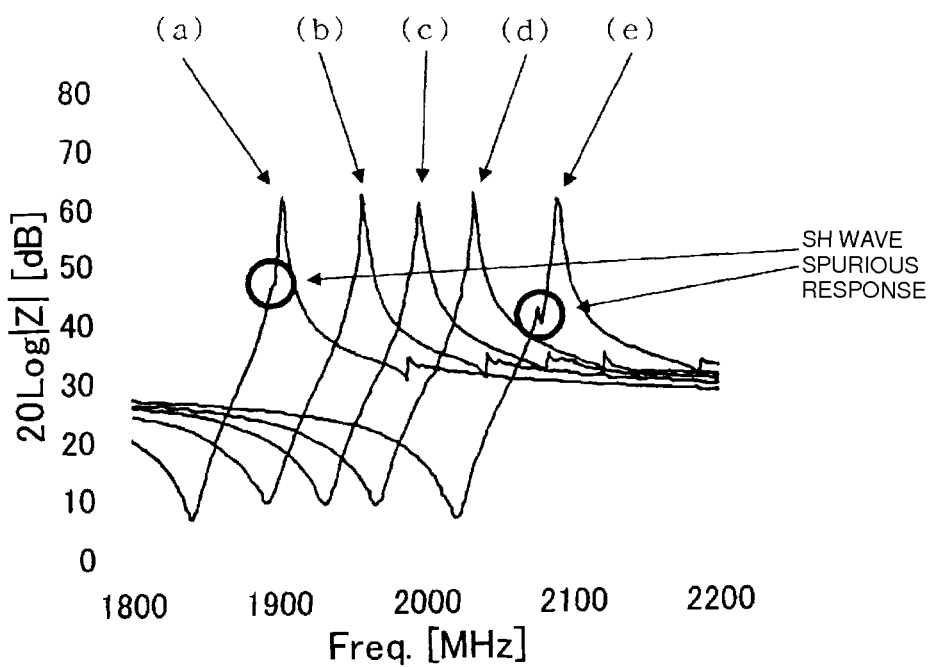

SURFACE ACOUSTIC WAVE ELEMENT

BACKGROUND OF THE INVENTION

1. Field of the Invention

The present invention relates to a surface acoustic wave element that has a configuration in which a top surface of each of a piezoelectric substrate and a comb-shaped electrode is covered with an insulating film and also relates to a method of manufacturing such a surface acoustic wave element.

2. Description of the Related Art

Mobile terminals, typified by cellular phones, require a large number of parts, including a filter device and a duplexer. In recent years, to address downsizing demands, a surface acoustic wave element has been frequently used as a resonator used in such parts.

A filter device used in high frequency bands of, for example, a cellular phone, is required to have good temperature characteristics. Accordingly, to improve a negative temperature coefficient of frequency that a piezoelectric substrate included in a surface acoustic wave element has, a silicon oxide film that has a positive temperature coefficient of frequency is disposed so as to cover the top surface of each of the piezoelectric substrate and a comb-shaped electrode.

If this silicon oxide film is formed by a conventional sputtering method, the silicon oxide film may have concavity and convexity in its surface or may have a crack or a cavity within the silicon oxide film. As a result, propagation efficiency of an elastic wave decreases, and an energy loss of a resonator increases. In Japanese Unexamined Patent Application Publication No. 2005-176152, a technique of planarizing the surface of a silicon oxide film formed by a bias sputtering method and making the inside of the silicon oxide film to have uniform density is proposed.

However, the configuration disclosed in Japanese Unexamined Patent Application Publication No. 2005-176152 is problematic as described below.

When the surface of a silicon oxide film is planarized, an energy loss of a resonator is reduced, but a spurious response occurs near a resonant frequency of a principal response. Accordingly, if a filter device is configured using this surface acoustic wave element, the frequency characteristic near its pass band decreases.

SUMMARY OF THE INVENTION

In view of the problems described above, preferred embodiments of the present invention provide a surface acoustic wave element that has a small energy loss and, when it is used in a filter device, for example, the surface acoustic wave device suppresses a spurious response occurring near a resonant frequency of a principal response and improves the frequency characteristic near the pass band of the filter device.

A surface acoustic wave element according to a preferred embodiment of the present invention includes a piezoelectric substrate, a comb-shaped electrode, and an insulating film. The comb-shaped electrode is disposed on the piezoelectric substrate. The insulating film is disposed so as to cover the piezoelectric substrate and the comb-shaped electrode. Where $\lambda$ is a wavelength of an elastic wave that propagates in the piezoelectric substrate and h is a difference between a maximum value and a minimum value of a thickness dimension from a top surface of the piezoelectric substrate to a top surface of the insulating film, $0.01 \leq h/\lambda \leq 0.03$ is satisfied.

The surface acoustic wave element according to a preferred embodiment of the present invention may preferably further include a medium disposed on the insulating film, the medium having an acoustic velocity that is different from that of the insulating film. In this case, the frequency of the surface acoustic wave element can be adjusted accurately.

For the surface acoustic wave element according to a preferred embodiment of the present invention, the medium may preferably be made of a material that has a higher moisture resistance than that of the insulating film. In this case, the moisture resistance of the surface acoustic wave element can be improved.

For the surface acoustic wave element according to a preferred embodiment of the present invention, the comb-shaped electrode may include a first electrode including a plurality of electrode fingers and a second electrode including a plurality of electrode fingers, the first and second electrodes being interdigitated.

For the surface acoustic wave element according to a preferred embodiment of the present invention, the insulating film may preferably have a temperature coefficient of frequency that has a sign opposite to that of the piezoelectric substrate or have a temperature coefficient of frequency that has an absolute value smaller than an absolute value of a temperature coefficient of frequency of the piezoelectric substrate. In this case, the surface acoustic wave element can have a good frequency-temperature characteristic.

For the surface acoustic wave element according to a preferred embodiment of the present invention, the piezoelectric substrate may preferably be made of a $LiNbO_3$ substrate or a $LiTaO_3$ substrate, and the insulating film may preferably be made of silicon oxide. In this case, the piezoelectric substrate has a negative temperature coefficient of frequency, whereas the insulating film has a positive TCF. Thus, the surface acoustic wave element can have a better frequency-temperature characteristic.

A method of manufacturing a surface acoustic wave element according to another preferred embodiment of the present invention includes an electrode forming step and an insulating film forming step. The electrode forming step includes the step of forming a comb-shaped electrode on a piezoelectric substrate. The insulating film forming step includes the step of forming an insulating film on a top surface of each of the piezoelectric substrate and the comb-shaped electrode. The insulating film forming step includes the step of forming the insulating film using bias sputtering such that $0.01 \leq h/\lambda \leq 0.03$ is satisfied, where $\lambda$ is a wavelength of an elastic wave that propagates in the piezoelectric substrate and h is a difference between a maximum value and a minimum value of a thickness dimension from the top surface of the piezoelectric substrate to a top surface of the insulating film.

The method of manufacturing a surface acoustic wave element according to a preferred embodiment of the present preferred embodiment may preferably further include the step of forming a medium on the insulating film, the medium having an acoustic velocity different from that of the insulating film.

For the method of manufacturing a surface acoustic wave element according to the present preferred embodiment, in the step of forming the medium, the medium may preferably be formed using a material that has a higher moisture resistance than that of the insulating film.

For the method of manufacturing a surface acoustic wave element according to a preferred embodiment of the present preferred embodiment, the electrode forming step may form a first electrode including a plurality of electrode fingers and a second electrode including a plurality of electrode fingers, the first and second electrodes being interdigitated.

For the method of manufacturing a surface acoustic wave element according to a preferred embodiment of the present invention, in the insulating film forming step, the insulating film may preferably be made of a material that has a temperature coefficient of frequency that has a sign opposite to that of the piezoelectric substrate or has a temperature coefficient of frequency that has an absolute value smaller than an absolute value of a temperature coefficient of frequency of the piezoelectric substrate. In this case, the surface acoustic wave element having a better frequency-temperature characteristic can be manufactured.

For the method of manufacturing a surface acoustic wave element according to a preferred embodiment of the present invention, a $LiNbO_3$ substrate or a $LiTaO_3$ substrate may preferably be used as the piezoelectric substrate and, in the insulating film forming step, the insulating film may preferably be made of silicon oxide. In this case, the piezoelectric substrate has a negative temperature coefficient of frequency, whereas the insulating film has a positive TCF. Thus, the surface acoustic wave element having a better frequency-temperature characteristic can be manufactured.

With various preferred embodiments of the present invention, a surface acoustic wave element that has a small energy loss and, when it is used in a filter device, for example, effectively and reliably suppresses a spurious component that occurs near the resonant frequency of a principal response and can improve the frequency characteristic near the pass band of the filter device is provided.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 1 is a schematic cross-sectional view of a surface acoustic wave element according to a first preferred embodiment of the present invention.

FIG. 2 includes graphs that plot impedance characteristics of various surface acoustic wave elements whose insulating films have different sizes h of surface unevenness.

DETAILED DESCRIPTION OF THE PREFERRED EMBODIMENTS

Examples of preferred embodiments of the present invention are described below with reference to the drawings.

FIG. 1 schematically illustrates a cross section of a surface acoustic wave element according to a first preferred embodiment of the present invention. A surface acoustic wave element 10 includes a piezoelectric substrate 11, a comb-shaped electrode 12, and an insulating film 13.

The piezoelectric substrate 11 preferably is made of a lithium niobate ($LiNbO_3$) substrate, for example. Alternatively, a lithium tantalate ($LiTaO_3$) substrate may also be used as the piezoelectric substrate 11, for example.

Figure 7:
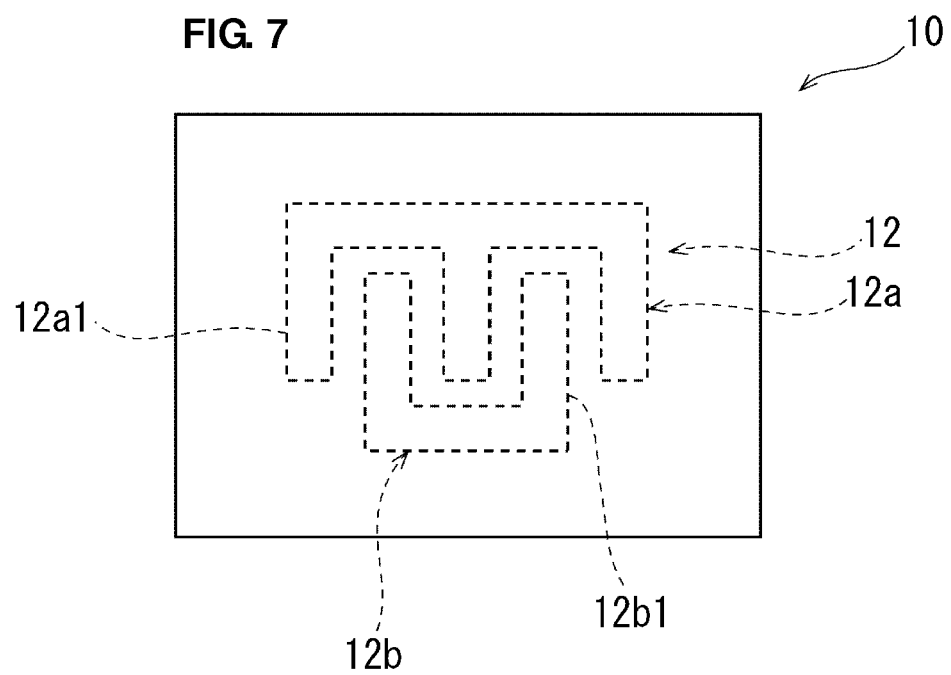
FIG. 7 is a schematic plan view of the surface acoustic wave element according to the first preferred embodiment of the present invention.

As illustrated in FIG. 7, the comb-shaped electrode 12 includes a first electrode 12a and a second electrode 12b. The first electrode 12a includes a plurality of electrode fingers 12a1 arranged in parallel or substantially in parallel to each other. The second electrode 12b includes a plurality of electrode fingers 12b1 arranged in parallel or substantially in parallel to each other. The first electrode 12a and the second electrode 12b are interdigitated. For the surface acoustic wave element 10, a surface acoustic wave having a wavelength that corresponds to the pitch of the electrode fingers of the comb-shaped electrode 12 is excited. The metal material forming the comb-shaped electrode 12 may preferably be a metal that has a higher density than that of silicon oxide, for example. Examples of the metal having a higher density than that of silicon oxide include copper, gold, and platinum, for example.

The insulating film 13 preferably is made of silicon oxide, for example.

Rayleigh waves are preferably used as the propagation mode of a principal response, for example. Instead of Rayleigh waves, Love waves may also be used as the propagation mode of a principal response.

As illustrated in FIG. 1, the comb-shaped electrode 12 is disposed on the piezoelectric substrate 11, and the insulating film 13 is disposed so as to cover the top of each of these piezoelectric substrate and comb-shaped electrode. The wavelength-normalized minimum thickness $H/\lambda$ of the insulating film 13 normalized by the wavelength $\lambda$ of an elastic wave that propagates in the piezoelectric substrate may preferably be equal to or more than about 0.2, for example.

The insulating film 13 is preferably formed by a bias sputtering method to prevent a cavity or gap from occurring inside the film. Increasing the filling factor of the insulating film 13 in this way enables further reduction in the temperature coefficient of frequency of the surface acoustic wave element 10.

Examples of a method of forming the insulating film 13 by which no cavity or gap occurs inside the insulating film 13 can include chemical-vapor deposition (CVD), in addition to bias sputtering.

Furthermore, the surface of the insulating film 13 is not flat but uneven on purpose.

The insulating film 13 is formed preferably by application of predetermined bias sputtering conditions such that the normalized value $h/\lambda$ (hereinafter referred to as "wavelength-normalized surface unevenness width"), in which the size h of the unevenness of the surface of the insulating film (hereinafter referred to as "surface unevenness width"), that is, the difference between the maximum and minimum values of the thickness dimension from the top surface of the piezoelectric substrate 11 to the top surface of the insulating film 13 is normalized by the wavelength $\lambda$ of an elastic wave that propagates in the piezoelectric substrate 11, satisfies $0.01 \leq h/\lambda \leq 0.03$. Here, the bias sputtering conditions include a substrate temperature and a sputtering rate.

FIG. 2 includes graphs that plot impedance characteristics of various surface acoustic wave elements 10 having different wavelength-normalized surface unevenness widths $h/\lambda$ of the insulating film 13.

The graph (a) in FIG. 2 plots an impedance characteristic of the surface acoustic wave element when the surface of the insulating film 13 is flat and the wavelength-normalized surface unevenness width h/λ is zero. The graph (a) in FIG. 2 reveals that, when the surface of the insulating film 13 is flat, a spurious response of a shear horizontal (SH) wave occurs near the resonant frequency in principal response mode.

The graph (b) in FIG. 2 plots an impedance characteristic of the surface acoustic wave element when the wavelength-normalized surface unevenness width h/λ of the insulating film 13 is about 0.01. The graph (c) in FIG. 2 plots an impedance characteristic of the surface acoustic wave element when the wavelength-normalized surface unevenness width h/λ is 0.02. The graph (d) in FIG. 2 plots an impedance characteristic of the surface acoustic wave element when the wavelength-normalized surface unevenness width h/λ is about 0.03. The graphs (b), (c), and (d) in FIG. 2 reveal that, when the surface of the insulating film 13 is not flat and the wavelength-normalized surface unevenness width h/λ is larger than 0 and equal to or more than about 0.03, no spurious response of an SH wave occurs near the resonant frequency in principal response mode.

The graph (e) in FIG. 2 plots an impedance characteristic of the surface acoustic wave element when the wavelength-normalized surface unevenness width h/λ is about 0.06. The graph (e) in FIG. 2 reveals that, even though the surface of the insulating film 13 is not flat, when wavelength-normalized surface unevenness width h/λ is larger than about 0.03, a spurious response of an SH wave occurs near the resonant frequency in principal response mode.

These graphs (a) to (d) in FIG. 2 reveal that setting the wavelength-normalized surface unevenness width h/λ of the insulating film 13 in a range from about 0.01 to about 0.03 can reduce a spurious response of an SH wave that will occur when the surface of the insulating film 13 is flat.

Figure 3:
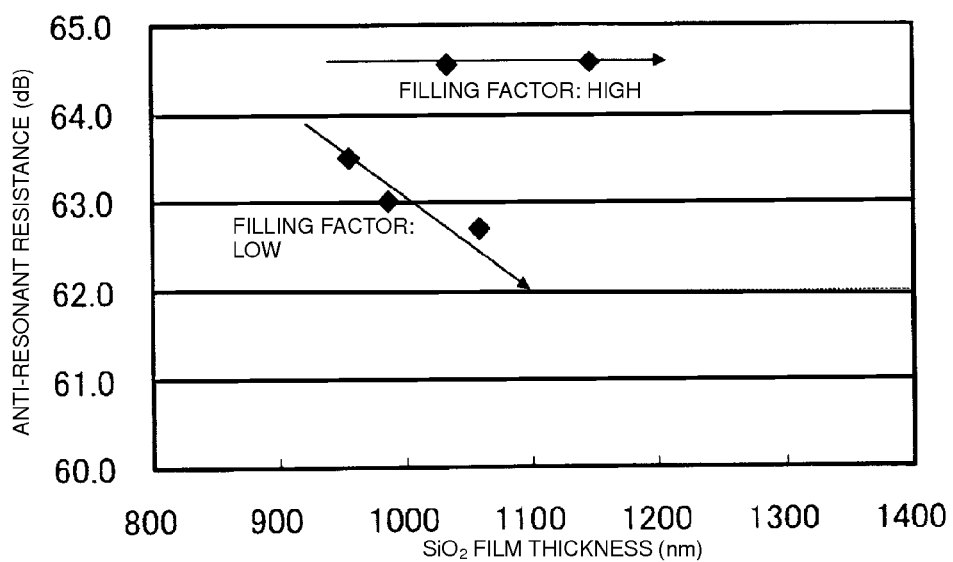
FIG. 3 includes graphs that plot relations between the thickness of an insulating film and anti-resonant resistance of a surface acoustic wave element.

FIG. 3 includes graphs that plot relations between the thickness of the insulating film 13 made of a $SiO_2$ film and the anti-resonant resistance of the surface acoustic wave element. In FIG. 3, the graph indicated by "filling factor: high" is a graph for the insulating film 13 formed by a bias sputtering method; and the graph indicated by "filling factor: low" is a graph for the insulating film 13 formed by RF sputtering.

The graphs in FIG. 3 reveal that the formation of the insulating film 13 with a high filling factor by the bias sputtering method can increase the anti-resonant resistance of the surface acoustic wave element even if the insulating film 13 is thick. That is, it is shown that the resonator characteristics of the surface acoustic wave element can be kept good. Consequently, it is shown that the formation of the insulating film 13 with a high filling factor by bias sputtering can achieve both good resonator characteristics and a good TCF.

Consequently, the surface acoustic wave element 10 according to the present preferred embodiment can have a small energy loss and, when it is used in a filter device, for example, can suppress a spurious response that occurs near the resonant frequency of a principal response and can improve the frequency characteristic near the pass band of the filter device.

Figure 4:
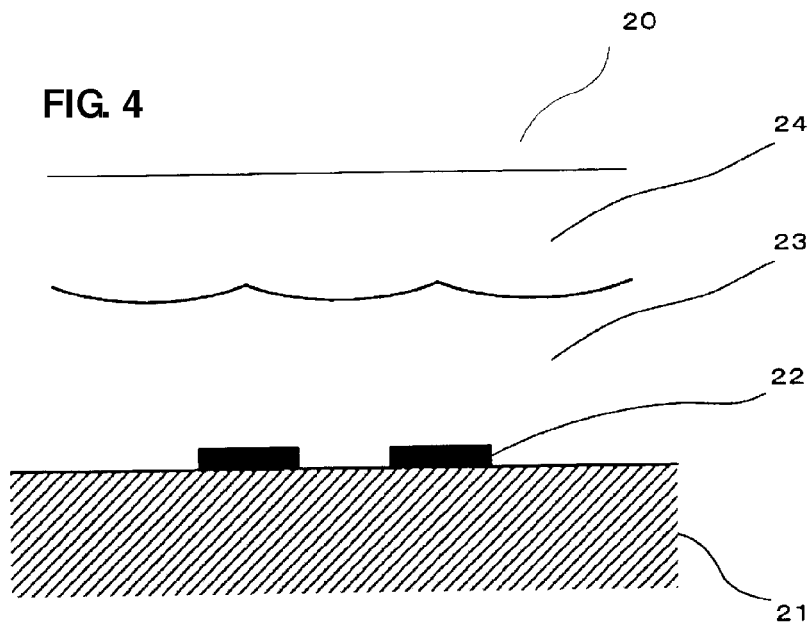
FIG. 4 is a schematic cross-sectional view of a surface acoustic wave element according to a second preferred embodiment of the present invention.

FIG. 4 schematically illustrates a cross section of a surface acoustic wave element according to a second preferred embodiment of the present invention. A surface acoustic wave element 20 according to this second preferred embodiment includes a piezoelectric substrate 21, a comb-shaped electrode 22, and an insulating film 23, as in the first preferred embodiment. The constituent material of each of them can preferably be the same as in the first preferred embodiment, for example.

Moreover, a medium 24 is disposed on the insulating film 23. That is, for the surface acoustic wave element 20, the medium 24 having an acoustic velocity different from that of the insulating film 23 is disposed on the insulating film 23 having a wavelength-normalized surface unevenness width h/λ that is between about 0.01 and about 0.03 inclusive. For the present preferred embodiment, the medium 24 preferably is made of silicon nitride, for example. Alternatively, the medium 24 may also be made of tantalum oxide, for example.

Figure 5:
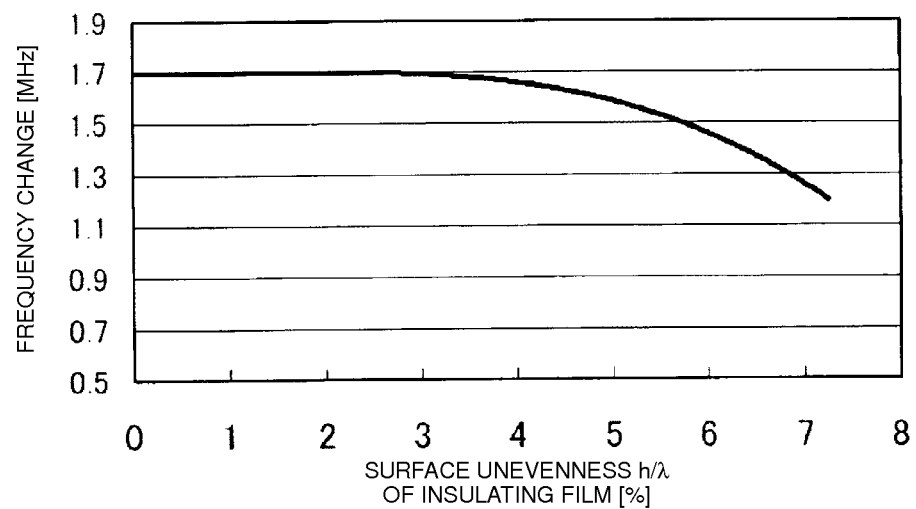
FIG. 5 is a graph that plots a relationship between the wavelength-normalized surface unevenness width $h/\lambda$ of an insulating film and the frequency change in resonant frequency of the surface acoustic wave element when a medium was etched for a certain period of time according to the second preferred embodiment of the present invention.

Etching this medium 24 enables adjustment of the frequency of the surface acoustic wave element 20. FIG. 5 illustrates a relationship between the wavelength-normalized surface unevenness width h/λ of the insulating film 23 and the frequency change in resonant frequency of the surface acoustic wave element 20 occurring when the medium 24 was etched for a certain period of time.

The graph illustrated in FIG. 5 reveals that, when the wavelength-normalized surface unevenness width h/λ is about 3% or less, the resonant frequency is largely changed by etching of the medium 24. This shows that, when the wavelength-normalized surface unevenness width h/λ of the insulating film 23 is at or below about 3%, the frequency can be effectively adjusted by etching of the medium 24. However, as the wavelength-normalized surface unevenness width h/λ increases from about 3%, even with etching, the frequency change tends to reduce. Accordingly, providing the medium 24 and setting the wavelength-normalized surface unevenness width h/λ at about 3% or less, that is, at about 0.03 or less can also offer an advantageous effect of facilitating adjustment of the frequency characteristic of the surface acoustic wave element.

The medium 24 may preferably be made of a moisture-resistant material. Specifically, the medium 24 may preferably be made of a material that has a higher moisture resistance than that of the insulating film 23. In this case, if the wavelength-normalized surface unevenness width h/λ of the insulating film 23 is larger than about 0.3%, when the frequency is adjusted by etching of the medium 24, as described above, the medium 24 at the projections of the insulating film 23 is cut preferentially. That is, the medium 24 is chipped and the moisture resistance of the surface acoustic wave element is degraded.

However, if the wavelength-normalized surface unevenness width h/λ of the insulating film 23 is about 3% or less, the portions of the medium 24 directly above the projections of the insulating film 23 is not cut in preference over the portions of the medium 24 at other than the projections of the insulating film 23. Therefore, the medium 24 is not easily chipped. Accordingly, degradation in moisture resistance of the surface acoustic wave element can be effectively prevented.

If the insulating film 23 is made of silicon oxide, examples of a material that has a higher moisture resistance than that of the insulating film 23 can include silicon nitride and tantalum oxide, for example. If the insulating film 23 is made of silicon nitride, examples of a material that has a higher moisture resistance than that of the insulating film 23 can include titanium oxide and diamond-like carbon (DLC), for example.

Figure 6:
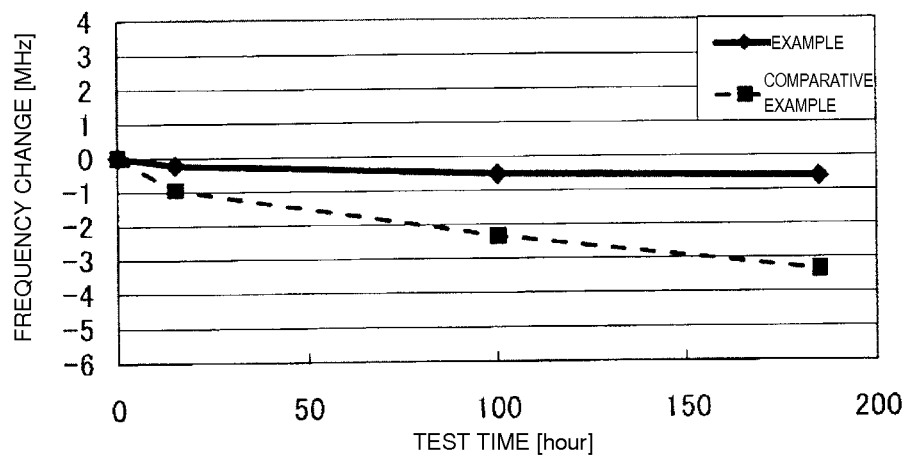
FIG. 6 is graphs that plot relationships between the length of time for which the surface acoustic wave element stood in a moist environment and the frequency change of the resonant frequency of the surface acoustic wave element.

FIG. 6 illustrates relationships between the length of time for which the surface acoustic wave element stood in a moist environment of about 93° C. and about 81% and the frequency change in resonant frequency of the surface acoustic wave element. In FIG. 6, the solid line is a graph for a surface acoustic wave element according to the present preferred embodiment that has a wavelength-normalized surface unevenness width h/λ of about 3% (about 0.03), and the broken line is a graph for a surface acoustic wave element according to a comparative example that has a wavelength-normalized surface unevenness width h/λ of about 7% (about 0.07).

As is apparent from FIG. 6, for the present preferred embodiment, in which the wavelength-normalized surface unevenness width h/λ is about 0.03, the frequency change in resonant frequency of the surface acoustic wave element after 180 hours is less than 1 MHz, whereas for the comparative example, in which the wavelength-normalized surface unevenness width h/λ is larger than about 0.03, the frequency change after standing for the same hours is equal to or more than about 3 MHz. Accordingly, it is found that setting the wavelength-normalized surface unevenness width h/λ at about 0.03 or less enables improvement in the moisture resistance of the surface acoustic wave element.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A surface acoustic wave element comprising:
   a piezoelectric substrate;
   a comb-shaped electrode disposed on the piezoelectric substrate; and
   an insulating film disposed so as to cover the piezoelectric substrate and the comb-shaped electrode; wherein
   the piezoelectric substrate, the comb-shaped electrode, and the insulating film are arranged to utilize a Rayleigh wave as a propagation mode of a principal response;
   the comb-shaped electrode is made of a material including at least one of copper and platinum as a primary component that has a higher density than a material from which the insulating film is made; and
   $0.01 \leq h/\lambda \leq 0.03$ is satisfied, where $\lambda$ is a wavelength of an elastic wave that propagates in the piezoelectric substrate and h is a difference between a maximum value and a minimum value of a thickness dimension from a top surface of the piezoelectric substrate to a top surface of the insulating film.

2. The surface acoustic wave element according to claim 1, further comprising a medium disposed on the insulating film, wherein the medium has an acoustic velocity different from that of the insulating film.

3. The surface acoustic wave element according to claim 2, wherein the medium is made of a material that has a higher moisture resistance than that of the insulating film.

4. The surface acoustic wave element according to claim 1, wherein the comb-shaped electrode includes a first electrode including a plurality of electrode fingers and a second electrode including a plurality of electrode fingers, and the first and second electrodes are interdigitated with each other.

5. The surface acoustic wave element according to claim 1, wherein the insulating film has a temperature coefficient of frequency that has a sign opposite to that of the piezoelectric substrate or has a temperature coefficient of frequency that has an absolute value smaller than an absolute value of a temperature coefficient of frequency of the piezoelectric substrate.

6. The surface acoustic wave element according to claim 1, wherein the piezoelectric substrate is a $LiNbO_3$ substrate or a $LiTaO_3$ substrate, and the insulating film is made of silicon oxide.

* * * * *